(12) United States Patent
Augustyniak et al.

(10) Patent No.: US 10,378,109 B2
(45) Date of Patent: Aug. 13, 2019

(54) DIAGNOSTIC AND CONTROL SYSTEMS AND METHODS FOR SUBSTRATE PROCESSING SYSTEMS USING DC SELF-BIAS VOLTAGE

(71) Applicant: Novellus Systems, Inc., San Jose, CA (US)

(72) Inventors: Edward Augustyniak, Tualatin, OR (US); Douglas Keil, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 349 days.

(21) Appl. No.: 15/193,885

(22) Filed: Jun. 27, 2016

(65) Prior Publication Data

US 2016/0326650 A1 Nov. 10, 2016

Related U.S. Application Data

(62) Division of application No. 13/912,256, filed on Jun. 7, 2013, now Pat. No. 9,404,183.

(Continued)

(51) Int. Cl.
 *H01J 37/32* (2006.01)
 *C23C 16/505* (2006.01)
 (Continued)

(52) U.S. Cl.
 CPC ...... *C23C 16/505* (2013.01); *C23C 16/45565* (2013.01); *C23C 16/5096* (2013.01);
 (Continued)

(58) Field of Classification Search
 CPC . C23C 16/505; C23C 16/52; C23C 16/45565; C23C 16/5096; H01J 37/32091;
 (Continued)

(56) References Cited

U.S. PATENT DOCUMENTS

| 5,665,214 A | * | 9/1997 | Iturralde | C23C 14/0042 |
| | | | | 118/690 |
| 5,936,413 A | | 8/1999 | Booth et al. | |
| 2010/0007362 A1 | * | 1/2010 | Booth | H01J 37/32935 |
| | | | | 324/686 |

FOREIGN PATENT DOCUMENTS

| JP | 2000269146 A | * | 9/2000 | ....... C23C 16/45565 |
| TW | 201126642 A | | 8/2011 | |

OTHER PUBLICATIONS

Song, Y.P., Field, D., Klemperer, D.F. (1990). Electrical potentials in RF discharges. Journal of Physics D: Applied Physics, 23(6), pp. 673-681. doi:10.1088/0022-3727/23/6/006.

(Continued)

*Primary Examiner* — Yuechuan Yu

(57) ABSTRACT

A substrate processing system includes a processing chamber including a showerhead, a plasma power source and a pedestal spaced from the showerhead to support a substrate. A filter is connected between the showerhead and the pedestal. A variable bleed current circuit is connected between the filter and the pedestal to vary a bleed current. A controller is configured to adjust a value of the bleed current and configured to perform curve fitting based on the bleed current and DC self-bias voltage to estimate at least one of electrode area ratio, Bohm current, and radio frequency (RF) voltage at a powered electrode.

7 Claims, 11 Drawing Sheets

Related U.S. Application Data

(60) Provisional application No. 61/715,630, filed on Oct. 18, 2012, provisional application No. 61/657,331, filed on Jun. 8, 2012.

(51) Int. Cl.
*C23C 16/52* (2006.01)
*H01L 21/67* (2006.01)
*C23C 16/509* (2006.01)
*C23C 16/455* (2006.01)

(52) U.S. Cl.
CPC ........ *C23C 16/52* (2013.01); *H01J 37/32091* (2013.01); *H01J 37/32174* (2013.01); *H01J 37/32183* (2013.01); *H01J 37/32266* (2013.01); *H01J 37/32917* (2013.01); *H01J 37/32926* (2013.01); *H01L 21/67011* (2013.01); *H01J 37/32082* (2013.01); *H01J 37/32128* (2013.01); *H01J 2237/3321* (2013.01)

(58) Field of Classification Search
CPC ........... H01J 37/32174; H01J 37/32266; H01J 37/32917; H01J 37/32926; H01J 2237/3321; H01J 21/67011; H01J 37/32183; H01J 37/32082; H01J 37/32128; H01L 21/67011
See application file for complete search history.

(56) References Cited

OTHER PUBLICATIONS

Köhler, K., Coburn, J.W., Horne, D.E., Kay, E. (1985). Plasma potentials of 13.56-MHz rf argon glow discharges in a planar system. Journal of Applied Physics, 57(1), pp. 59-66, doi: 10.1063/1.335396.

Notification of Examination Opinions dated Jan. 9, 2017 corresponding to Taiwanese Patent Application No. 102120572, 7 pages.

* cited by examiner

DIAGNOSTIC AND CONTROL SYSTEMS AND METHODS FOR SUBSTRATE PROCESSING SYSTEMS USING DC SELF-BIAS VOLTAGE

CROSS-REFERENCE TO RELATED APPLICATIONS

The present disclosure is a divisional of U.S. patent application Ser. No. 13/912,256 filed on Jun. 6, 2013. This application claims the benefit of U.S. Provisional Application No. 61/715,630, filed on Oct. 18, 2012 and U.S. Provisional Application No. 61/657,331, filed Jun. 8, 2012. The entire disclosures of the applications referenced above are incorporated herein by reference.

FIELD

The present disclosure relates to substrate processing systems and more particularly to diagnostic and control systems and methods for substrate processing systems using DC self-bias voltage.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing tools are used to deposit material on a substrate and/or to etch material from the substrate. For example, the substrate may include a semiconductor wafer. Some substrate processing tools generate plasma during operation. Examples include plasma enhanced chemical vapor deposition (PECVD) systems, plasma enhanced atomic layer deposition (PEALD) systems, etc. Plasma may be generated in these systems using capacitively coupled plasma (CCP).

Most of the systems using CCP offer a very limited number of plasma diagnostic measurements (such as pressure, system voltages, currents, etc.) which can be used to adjust setpoint operating parameters as chamber pressure, gas flow and RF power. Furthermore, pressure, gas flow and RF power signals may not give complete characterization of the system. Such an incomplete characterization can lead to process drift. Additional system metrics are often needed for adequate system control.

SUMMARY

A substrate processing system includes a processing chamber including a showerhead, a plasma power source and a pedestal spaced from the showerhead to support a substrate. A filter is connected between the showerhead and the pedestal. A variable bleed current circuit is connected between the filter and the pedestal to vary a bleed current. A controller is configured to adjust a value of the bleed current and configured to perform curve fitting based on the bleed current and DC self-bias voltage to estimate at least one of electrode area ratio, Bohm current, and radio frequency (RF) voltage at a powered electrode.

In other features, the variable bleed current circuit comprises a variable resistor circuit. The controller is configured to vary a resistance of the variable resistor circuit to N values and to record N pairs of the bleed current and the DC self-bias voltage, wherein N is an integer greater than one. The controller is configured to perform the curve fitting based on the N values of the bleed current and the DC self-bias voltage.

In other features, the variable bleed current circuit comprises a variable current source. The controller is configured to vary current supplied by the variable current source to N values and to record N pairs of the bleed current and the DC self-bias voltage, wherein N is an integer greater than one. The controller is configured to perform the curve fitting based on the N values of the bleed current and the DC self-bias voltage.

In other features, the substrate processing system performs deposition and the controller is configured to adjust a deposition operating parameter of the substrate processing system based on the at least one of the electrode area ratio, the Bohm current, and the radio frequency (RF) voltage at the powered electrode.

In other features, the controller is configured to perform diagnostics on the substrate processing system based on the at least one of the electrode area ratio, the Bohm current, and the radio frequency (RF) voltage at the powered electrode. The filter is configured to block radio frequency signals and to pass DC signals. The substrate processing system generates plasma using capacitive coupling. The plasma power source is coupled to the showerhead and wherein the pedestal is connected to ground.

In other features, a current sensor senses bleed current flowing through the variable resistor circuit. The controller is configured to estimate the Bohm current and to estimate plasma density from the Bohm current. The controller is configured to adjust a deposition operating parameter of the substrate processing system based on the plasma density.

A substrate processing system includes a processing chamber including a showerhead, a plasma power source and a pedestal spaced from the showerhead to support a substrate. The plasma power source supplies first radio frequency (RF) power to create plasma between the showerhead and the substrate. An RF power source is coupled by the first capacitor to the probe to supply second RF power. A controller is configured to estimate film thickness based on the second RF power and DC self-bias voltage.

In other features, the substrate processing system is configured to deposit film on the substrate and the controller is configured to alter an operating parameter of the substrate processing system based on the film thickness. The substrate processing system is configured to deposit film on the substrate. The controller is configured to determine a rate of change in the film thickness. The controller is configured to alter an operating parameter of the substrate processing system based on the rate of change of the film thickness.

In other features, the substrate processing system generates the plasma using capacitive coupling. The plasma power source is coupled to the showerhead. The pedestal is connected to ground. The second RF power is less than the first RF power.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The present disclosure describes the use of DC self-bias voltage in substrate processing systems using capacitively coupled plasma (CCP). The present disclosure monitors changes in DC self-bias voltage and/or bleed current to estimate other system parameters, for diagnostic purposes and/or for control of the substrate processing system.

Figure 1:
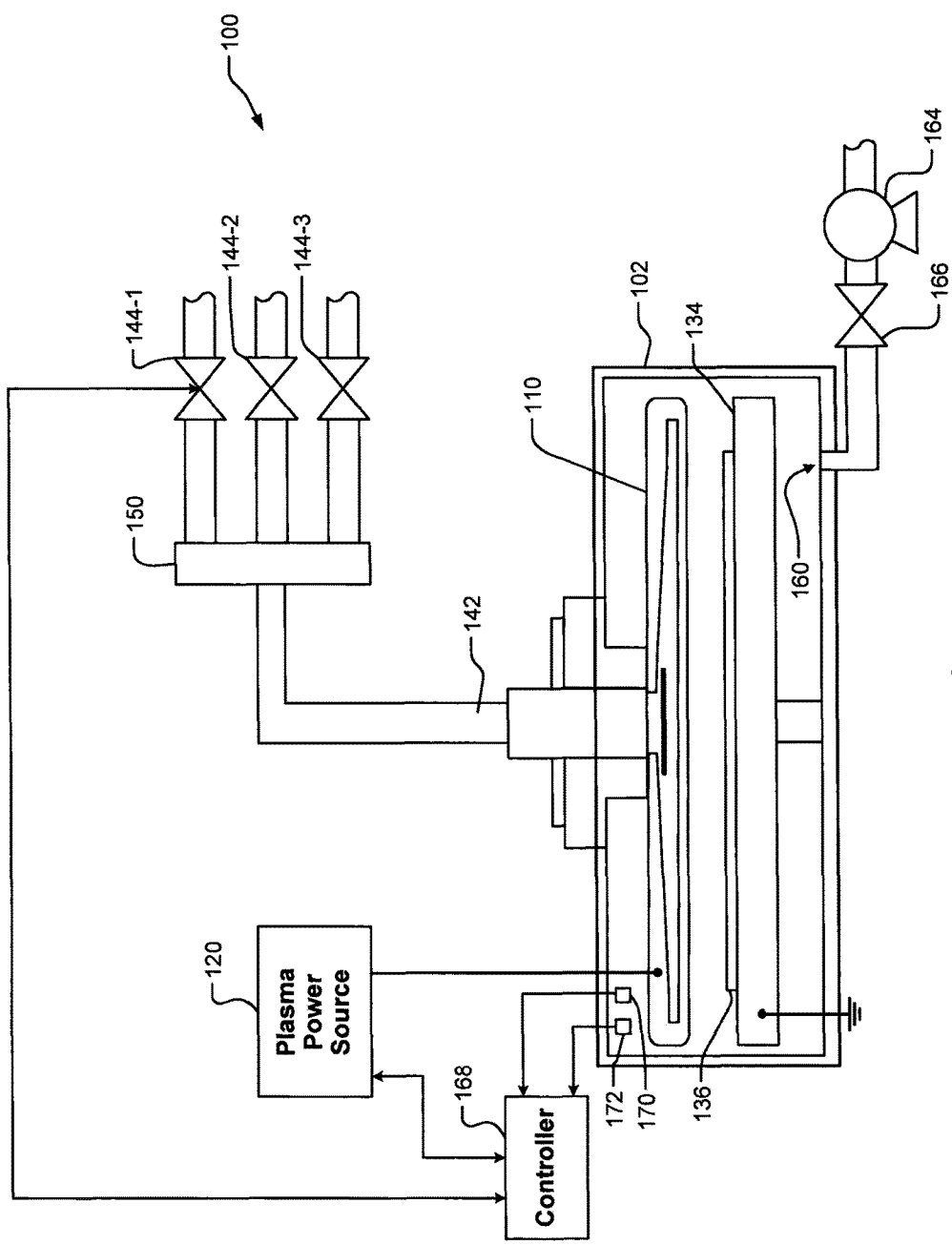
FIG. 1 is a functional block diagram of an example of a PECVD system.

Referring now to FIG. 1, an example of a semiconductor processing system 100 is shown and includes a process chamber 102. While a typical PECVD system is shown for illustration purposes, other substrate processing systems may be used. The semiconductor processing system 100 further includes a showerhead 110 to deliver process gases to the process chamber 102. A plasma power source 120 provides RF power to the showerhead 110 to create plasma. A pedestal 134 may be connected to a reference potential such as ground. Alternatively an electrostatic chuck (ESC) may be used in substitute for a pedestal (not common). The RF signals supplied by the plasma power source 120 have a power and a frequency sufficient to generate plasma from one or more process gases. In some examples, the plasma power source 120 may be connected to the pedestal 134 instead of the showerhead 110 and the showerhead 110 may be connected to ground.

The pedestal 134 may include a chuck, a fork, or lift pins (all not shown) to hold and transfer a substrate 136 during and between deposition and/or plasma treatment reactions. The chuck may be an electrostatic chuck, a mechanical chuck or various other types of chuck.

The process gases are introduced to the showerhead 110 via inlet 142. Multiple process gas lines are connected to a manifold 150. The process gases may be premixed or not. Appropriate valves and mass flow controllers (generally identified at 144-1, 144-2, and 144-3) are employed to ensure that the correct gases and flow rates are used during substrate processing. Process gases exit the process chamber 102 via an outlet 160. A vacuum pump 164 typically draws process gases out of the process chamber 102 and maintains a suitably low pressure within the reactor by a flow restriction device, such as a valve 166. A controller 168 may sense operating parameters such as chamber pressure and temperature inside the processing chamber using sensors 170 and 172. The controller 168 may control the valves and mass flow controllers 144-1, 144-2 and 144-3. The controller 168 may also control the plasma power source 120.

Measurement of Film Thickness

Figure 2A:
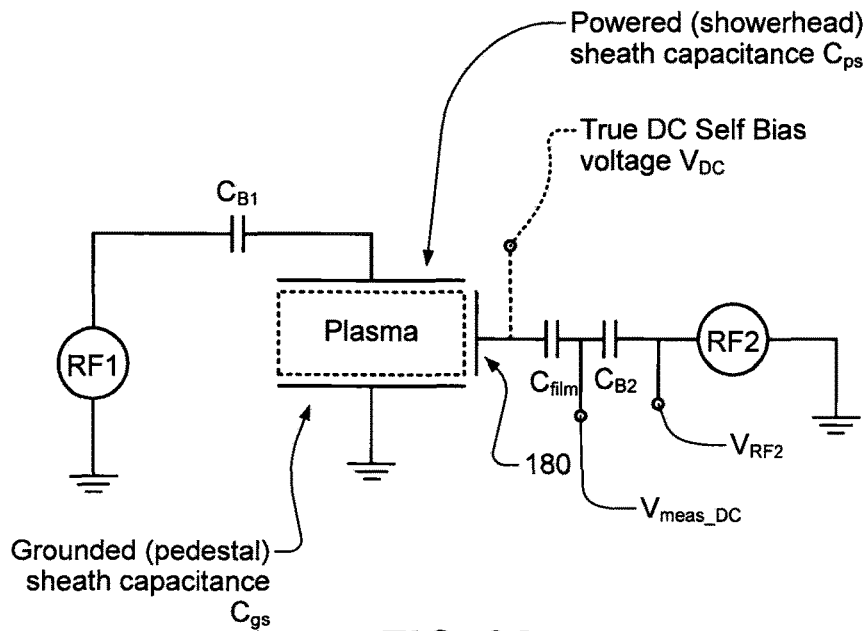
FIG. 2A is an electrical schematic of example of a capacitively coupled plasma (CCP) circuit according to the present disclosure.

Referring now to FIG. 2A, measurement of film growth may be performed as follows. Plasma is sustained by an RF generating source coupled to the plasma through a capacitor $C_{B1}$. For this discussion it is assumed that plasma exists only between the system electrodes and not between a powered electrode and the chamber walls (i.e. it is assumed there is no parasitic plasma). A probe 180 is introduced into the plasma. The probe 180 is driven by a second continuous RF source ($RF_2$) coupled to the probe 180 through a blocking capacitor $C_{B2}$ as shown in FIG. 2A. For this configuration, RF source $RF_1$ provides a first RF power level to sustain the plasma and is controlled using feedback to a given RF power set point. The second RF source $RF_2$ provides a second RF power level as is needed to provide a desired RF voltage at the terminals of the blocking capacitor $C_{B2}$. The RF signals from RF source $RF_1$ are continuous signals rather than pulsed RF signals. The second RF power level is less than the first RF power level. The second RF source $RF_2$ has a minimal perturbative effect on the plasma.

Application of RF energy to a plasma through a coupling (blocking) capacitor typically results in a DC self-bias voltage across that capacitor. A discussion of how this voltage is formed is given in Y. P. Song et. al., J Phys. D. Appl. Ph., V23 (1990), p. 673-681, which is hereby incorporated by reference in its entirety. The approach detailed in Song et. al. focuses on the current flows in the system and employs the fact that the time averaged DC currents through the system must equal zero. As such it may be described as a "current centric" approach. An alternative discussion of DC self-bias is given by K. Kohler et. al., J. Appl. Phys. 57 (1), January 1985 p. 58-66 which is hereby incorporated by reference in its entirety. This second approach notes that in the high electron mobility in all such systems forces the plasma potential to always achieve the highest positive potential in the system so that electron flow to walls or other surfaces is sufficiently low as to permit an equilibrium steady state condition. This results in several voltage conditions that must be satisfied if an equilibrium state is to occur. As such this approach may be described as a "voltage centric" approach. Thus a DC self-bias voltage is developed across the blocking capacitor $C_{B2}$. If no deposited film is present (i.e. $C_{film}=\infty$), then the measured DC self-bias voltage is the same as the DC self-bias voltage that would be measured on the surface of the probe 180 in contact with plasma. However if a film is deposited, there will be an additional capacitance added to this system in the form of $C_{film}$. For this case, the DC self-bias voltage of the surface in contact with the plasma does not change, but the measured DC self-bias voltage will change as a result of DC voltage division between $C_{film}$ and the blocking capacitor $C_{B2}$. This situation can be described by the equations below:

$$C_{film} = \frac{\varepsilon_o \varepsilon_r A_f}{d} \quad (1)$$

$$V_{meas\_DC} = V_{True\_DC} \frac{C_{Film}}{C_{Film} + C_{B2}} = V_{True\_DC} \frac{\varepsilon_o \varepsilon_r A_f}{\varepsilon_o \varepsilon_r A_f + C_{B2} d} \quad (2)$$

$$V_{True\_DC} = V_{RF2} \frac{C_{ps} - C_{gs}}{C_{ps} + C_{gs}} = V_{RF2} K; \quad (3)$$

$$d = \frac{\varepsilon_o \varepsilon_r A_f}{C_{B2}} \left( \frac{V_{RF2K}}{V_{meas\_DC}} - 1 \right). \quad (4)$$

where $A_f$ is the area of the electrode, d is the thickness of the film. From these equations, the change in the measured DC self-bias voltage will yield a measure of the deposited film capacitance. If the relative permittivity of this capacitance is known, the thickness of the deposited film can be determined.

Figure 2B:
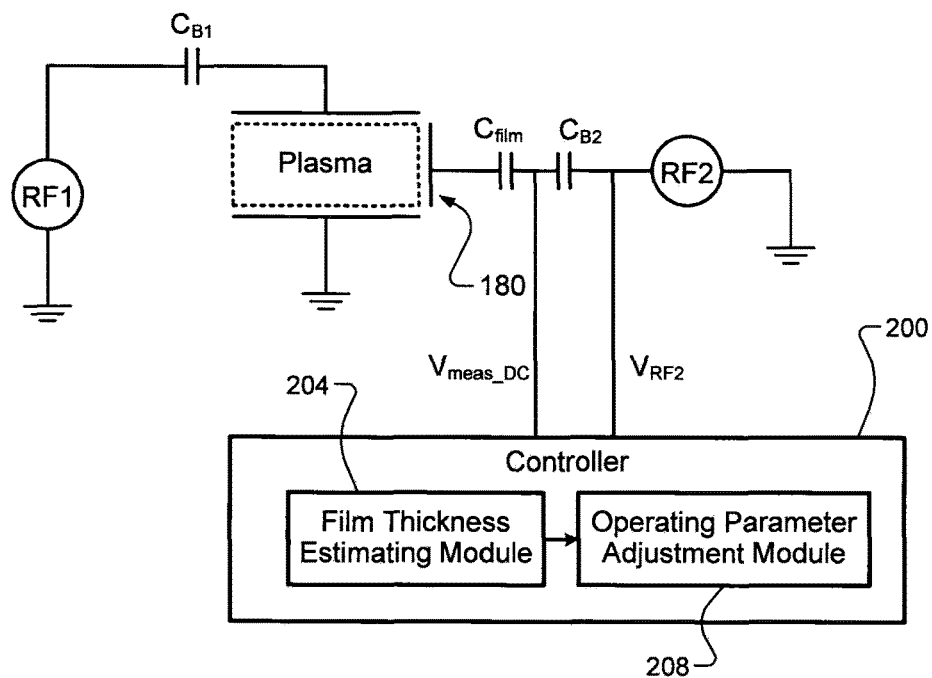
FIG. 2B is an electrical schematic and functional block diagram of example of CCP circuit and controller according to the present disclosure.

In FIG. 2B, a controller 200 includes a film thickness estimating module 204 and an operating parameter adjustment module 208. The controller 200 receives the measured DC voltage and the RF voltage $V_{RF2}$. The film thickness estimating module 204 estimates the film thickness based on the relationship set forth above. The operating parameter adjustment module 208 adjusts an operating parameter of the substrate processing system based on the film thickness and/or changes in the film thickness as a function of time.

Figure 3:
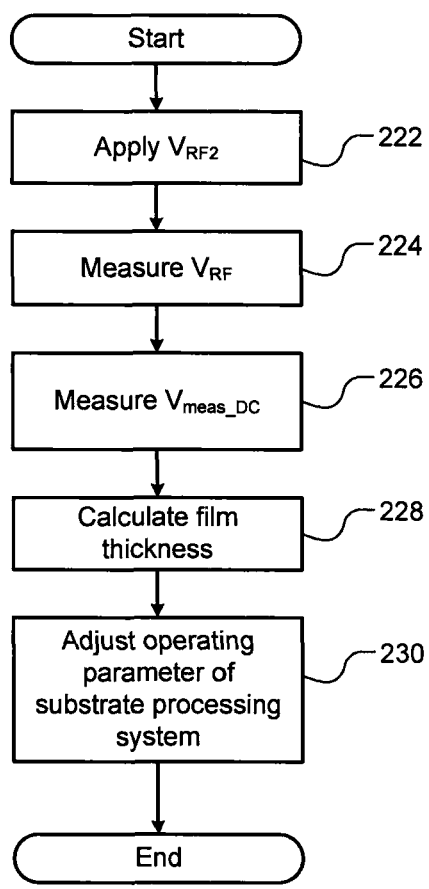
FIG. 3 illustrates an example of a method for operating the controller of FIG. 2B.

In FIG. 3, an example of a method for operating the controller of FIG. 2B is shown. At 222, $V_{RF2}$ is applied in the circuit of FIG. 2A and at 224 $V_{RF2}$ is measured. At 226, the DC self-bias voltage $V_{meas\_DC}$ is measured. At 228, the thickness of the film is calculated. At 230, one or more operating parameters of the substrate processing system are altered based on the film thickness and/or changes in the film thickness as a function of time.

Estimating Electrode Area Ratio, Bohm Current, and/or RF Voltage at the Powered Electrode The discussion of Y. P. Song et. al., J Phys. D. Appl. Ph., V23 (1990), p. 673-681 does not included analysis of the effect of a DC (only—no RF) current drawn from the RF powered electrode (be it either the showerhead or pedestal). This may be done by introducing an RF filter to prevent RF current from being drawn. However, the ideas presented by Y. P. Song et. al., J Phys. D. Appl. Ph., V23 (1990), p. 673-681 can be adapted to form an analysis that gives the DC self-bias voltage response to a DC current drawn (or "bled") from a powered electrode. As will be discussed below, this relationship between the bleed current and DC self-bias voltage can be used to predict DC self-bias voltage change in terms of electrode areas and Bohm current density to each electrode. In the following analysis, a current based approach will be used as discussed by Y. P. Song et. al. In the current based approach, the DC current averaged over an RF cycle must equal zero. This is the same as imposing the condition that no net DC current can flow through this system because of the presence of the blocking capacitor ($C_b$ in FIG. 7A). Using this condition, an expression for the DC self-bias voltage is derived.

As will be described more fully below, a resistance of a variable bleed resistor $R_V$ is adjusted to vary a bleed current $i_R$. For each value of the bleed resistor, the DC self-bias voltage and the bleed current values are recorded. Curve fitting is performed based on the pairs of values and a relationship (derived below) to estimate values for the effective electrode area ratio $$\frac{A_b}{A_a},$$

Bohm current $i_B$ and RF voltage at the electrode.

The Bohm current density $J_B$ (derived as $i_B$ divided by the electrode area) may also be used to estimate plasma density, which can be used as a feedback parameter to control an operating parameter of the substrate processing system and/or for diagnostic purposes. Likewise, the effective electrode area ratio and the RF voltage may be used for diagnostic purposes and/or as a feedback parameter to control an operating parameter of the substrate processing system. Changes in the effective electrode area ratios can signal hardware failures, presence of excessive parasitic plasma or an unwanted coating on the inner surface of the plasma chamber.

Figure 4:
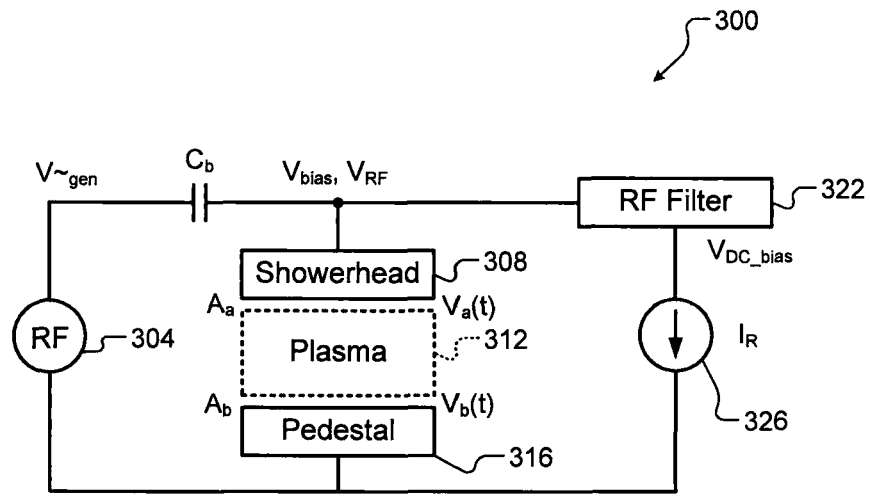
FIGS. 4 and 5 are electrical schematics of a circuit representing the substrate processing system.
Figure 5:
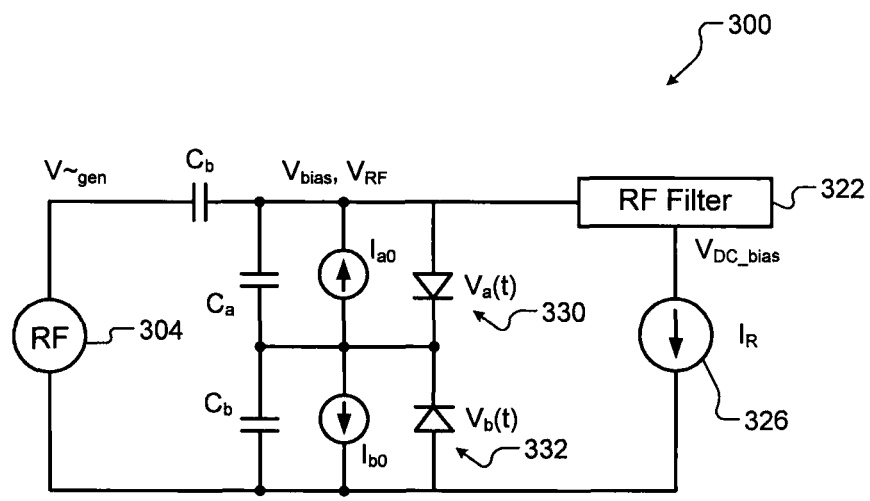

Referring now to FIGS. 4 and 5, circuit models are shown. In FIG. 4, a circuit 300 is shown to include an RF source 304 that is connected by a capacitor $C_b$ to a showerhead 308. For example only, the RF source 304 provides a signal $V_{RF}(t) = V_{RF} \sin(\omega t)$. Plasma 312 is created between the showerhead 308 and a pedestal 316. First and second sheath areas $A_a$ and $A_b$ are created with corresponding sheath voltages $V_a(t)$ and $V_b(t)$. An RF filter 322 is connected to the showerhead 308 and to a current source 326, which sources or sinks current $i_R$. The RF filter 322 is used to block RF signals and pass DC signals.

In FIG. 5, an equivalent schematic that simulates plasma is shown to include capacitors $C_a$ and $C_b$ connected in series, current sources $I_{a0}$ and $I_{b0}$ connected in series, and diodes 330 and 332 connected in series.

For a current based approach, several conditions must be satisfied. Current over an RF cycle to an electrode averages to zero if the bleed current is zero. If the bleed current is non-zero, the current over an RF cycle averages to the bleed current.

Figure 6:
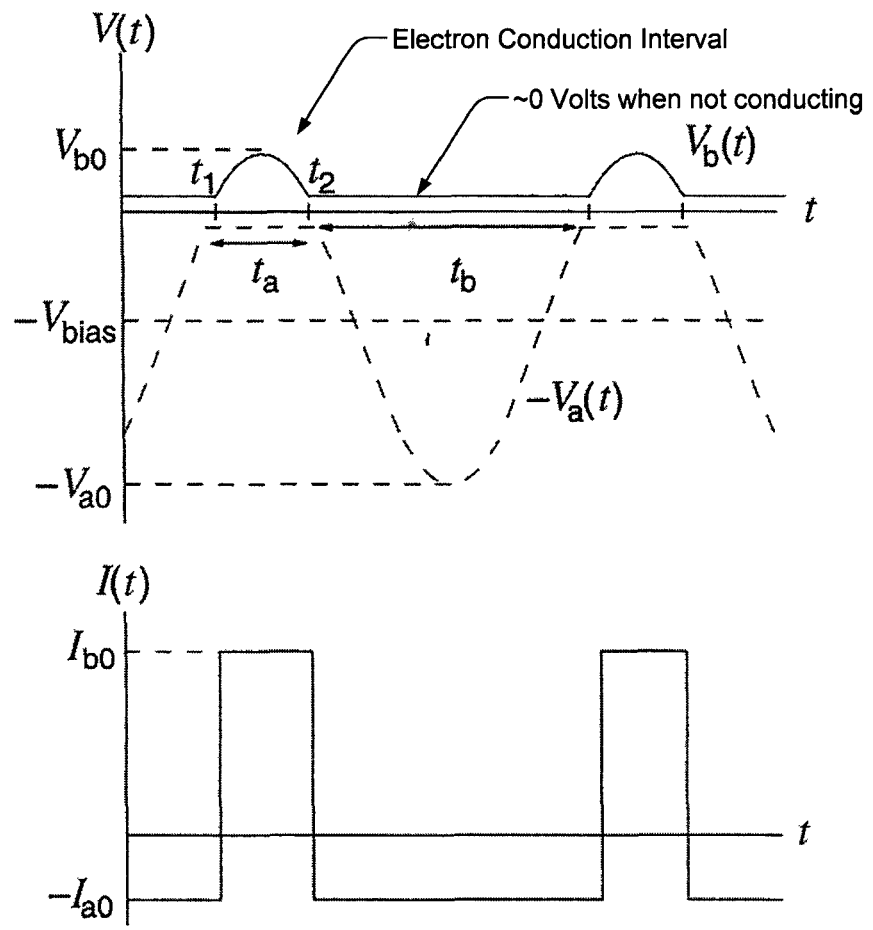
FIG. 6 illustrates time varying sheath voltages and currents.

Referring now to FIG. 6, time varying sheath voltages and currents are shown as a function of time. The following equations illustrate relationships between $t_1$ and $t_2$ and $t_a$ and $t_b$:

$$\frac{2\pi}{\omega} = T; \quad (5)$$

$$\frac{T}{4} - t_1 = t_2 - \frac{T}{4},$$

therefore $$t_2 = \frac{\pi}{\omega} - t_1;$$

$$t_a + t_b = \frac{2\pi}{\omega}; \quad (6)$$

and $$t_2 - t_1 = t_a. \quad (7)$$

Based on (5) and (6), the current balance relationship can be written as:

$$t_a J_{Bb} A_b - t_b J_{Ba} A_a = i_R (t_a + t_b) = \frac{2\pi}{\omega} i_R$$

where $J_{Ba}$ and $J_{Bb}$ are Bohm current densities at sheaths a and b, respectively. Using equation (6), the current balance relationship can be rewritten as:

$$\frac{2\pi}{\omega} i_R = t_a J_{Bb} A_b - \left(\frac{2\pi}{\omega} - t_a\right) J_{Ba} A_a;$$

$$i_R = \frac{t_a \omega}{2\pi}(J_{Bb} A_b + J_{Ba} A_a) - J_{Ba} A_a;$$

$$t_a = \frac{2\pi}{\omega}\left[\frac{i_R + J_{Ba} A_a}{J_{Bb} A_b + J_{Ba} A_a}\right]$$

There is a relationship between the voltage at $t_1$ or $V(t_1)$ and the voltages $V_{DC\_bias}$ and $V_{RF}$. The floating potential is assumed to be relatively small. Therefore:

$$V_b(t_1) \approx 0 = V_{RF} \sin(\omega t_1) - V_{DC\_bias};$$

$$V_{DC\_bias} = V_{RF} \sin(\omega t_1); \quad (8):$$

Using the relationship between $t_a$ and $t_1$:

$$\left.\begin{array}{l} t_a = t_2 - t_1 \\ t_2 = \frac{\pi}{\omega} - t_1 \end{array}\right\} t_a = t_2 - t_1 = \left(\frac{\pi}{\omega} - t_1\right) - t_1 = \frac{\pi}{\omega} - 2t_1; \quad (9)$$

Inserting (7) and (8) into (9) yields:

$$\frac{2\pi}{\omega}\left[\frac{i_R + J_{Ba} A_a}{J_{Bb} A_b + J_{Ba} A_a}\right] = \frac{\pi}{\omega} - \frac{2}{\omega} \sin^{-1}\left(\frac{V_{DC\_bias}}{V_{RF}}\right),$$

which can be rearranged as:

$$\frac{V_{DC\_bias}}{V_{RF}} = \sin\left\{\frac{\pi}{2}\left(1 - 2\left[\frac{i_R + J_{Ba} A_a}{J_{Bb} A_b + J_{Ba} A_a}\right]\right)\right\}; \quad (10)$$

or as $$\frac{V_{DC\_bias}}{V_{RF}} = \cos\left(\pi\left[\frac{i_R + J_{Ba} A_a}{J_{Bb} A_b + J_{Ba} A_a}\right]\right)$$

Assuming that the plasma has an electron temperature $T_e$ and that the sheath edge plasma densities are the same at both sheath edges, the Bohm current densities are the same at each sheath, or $J_{Ba} = J_{Bb} = J_B$. As a result, equation (10) can be rewritten as follows:

$$\frac{V_{DC\_bias}}{V_{RF}} = \cos\left(\pi\left[\frac{i_R + J_B A_a}{J_B A_b + J_B A_a}\right]\right); \quad (11)$$

$$\frac{V_{DC\_bias}}{V_{RF}} = \cos\left(\pi\left[\frac{\frac{i_R}{J_B A_a} + 1}{\frac{A_b}{A_a} + 1}\right]\right);$$

or $$\frac{V_{DC\_bias}}{V_{RF}} = \cos\left(\pi\left[\frac{\frac{i_R}{i_B} + 1}{\frac{A_b}{A_a} + 1}\right]\right)$$

where $i_B = J_B A_a$

As can be seen in equation (11), $$\frac{V_{DC\_bias}}{V_{RF}}$$

depends on the ratio of the total bleed current $i_R$ to the total Bohm current $i_B$ (or Bohm current density times the electrode area $J_B A_b$) and on the electrode area ratio $$\frac{A_b}{A_a}.$$

For small values of bleed current $i_R$ and $$\frac{A_b}{A_a} \approx 1,$$

the ratio of $$\frac{V_{DC\_bias}}{V_{RF}}$$

varies nearly linearly with bleed current $i_R$. For $$\frac{A_b}{A_a} \approx 1,$$

the ratio of $$\frac{V_{DC\_bias}}{V_{RF}}$$

departs from linearity as bleed current $i_R$ becomes a significant fraction of the Bohm current $i_B$.

Figure 7A:
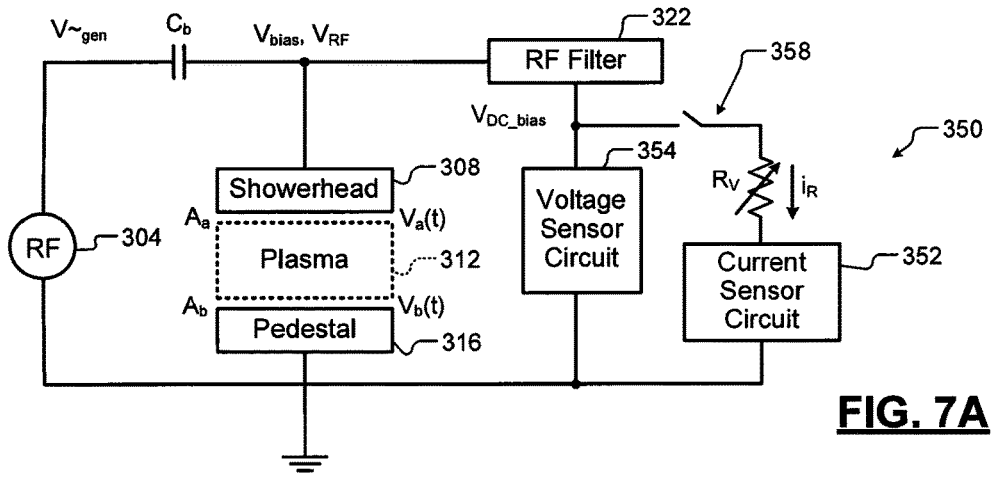
FIG. 7A illustrates the circuit of FIG. 4 with a variable bleed resistor circuit and current sensor circuit.

Referring now to FIG. 7A, the circuit 300 of FIG. 4 is shown to include a variable bleed current circuit 350 to vary the bleed current. For example only, the variable bleed current circuit 350 may include a variable resistor circuit $R_V$. A resistance value of the variable resistor circuit $R_V$ may be varied to adjust the bleed current. A current sensor circuit 352 senses the bleed current. A voltage sensor circuit 354 senses the DC self-bias voltage. A switch 358 may be used to connect and disconnect the variable bleed current circuit 350. The voltage sensor circuit 354 preferably has a high impedance. In some examples, the impedance of the voltage sensor circuit 354 is greater than 10 MΩ. The current sensor circuit 352 preferably has zero impedance or a very low impedance.

In one example, plasma was generated using nitrogen $N_2$ at a pressure of 2.5 Torr and RF power of 200 Watts at 13.56 MHz. Work was done at 2.5 Torr because the plasma was observed to be well localized to the electrodes. This lack of plasma spreading provided a constant effective electrode area ratio and allowed geometric estimation of the effective electrode area ratio. A DC power supply was connected to the showerhead via a filter, which provided 35 dB attenuation at 13.56 MHz. Bleed current $i_R$ and DC self-bias voltage pairs were measured using multiple different bleed resistor values set by a variable bleed resistor $R_V$.

Figure 7B:
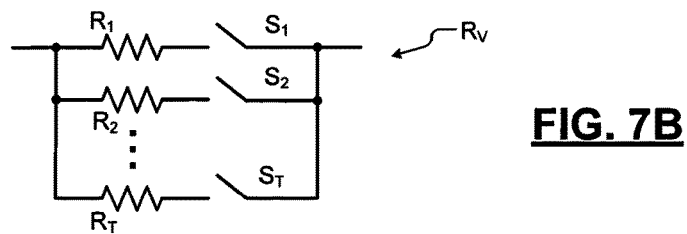
FIG. 7B illustrates an example of the variable bleed resistor circuit.

In FIG. 7B, an example of a variable bleed resistor $R_V$ is shown to include series connected pairs of resistors $R_1$, $R_2$, ... and $R_T$ and switches $S_1$, $S_2$, ... and $S_T$, respectively, that are connected in parallel, where T is an integer greater than one. The switches $S_1$, $S_2$, ... and $S_T$ can be opened or closed to provide different resistance values. This would allow variation in the amount of current bled from the showerhead. As can be appreciated, other arrangements and combinations of switches and resistors can be used.

Figure 7C:
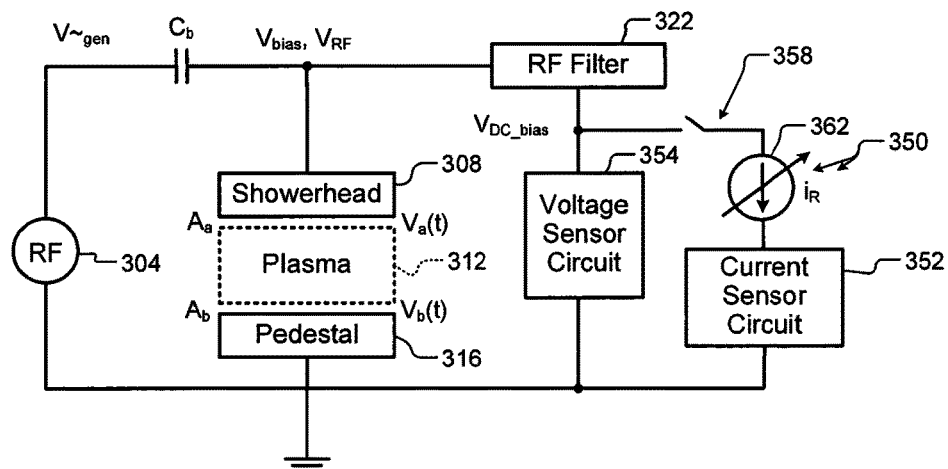
FIG. 7C illustrates the circuit of FIG. 4 with a variable current source and current sensor circuit.

In FIG. 7C, the variable bleed current circuit 350 is shown to include a variable current source 362 to vary the bleed current.

Figure 8:
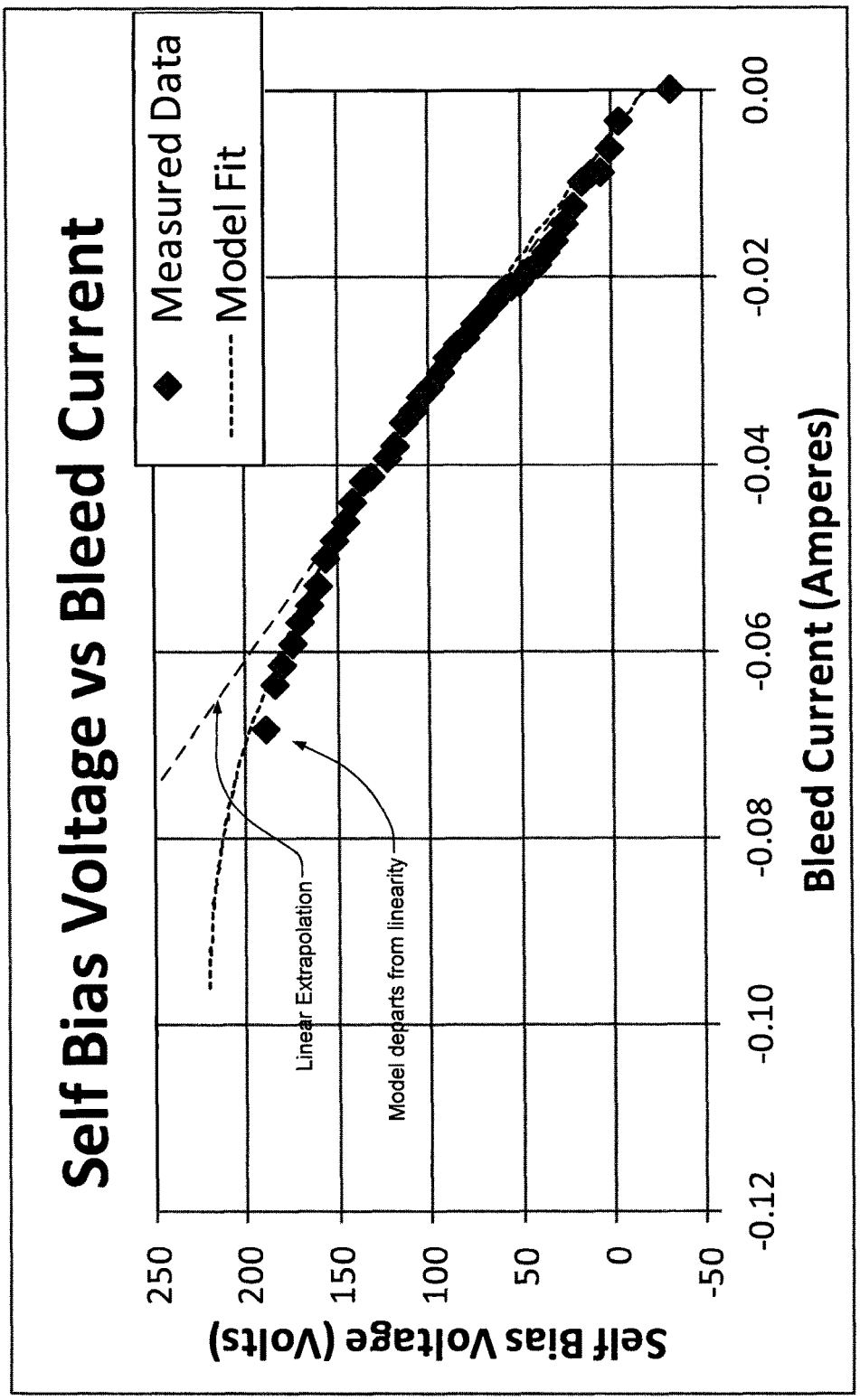
FIG. 8 illustrates DC self-bias voltage as a function of bleed current.

Referring now to FIG. 8, the DC self-bias voltage $V_{DC\_bias}$ is shown relative to the bleed current $i_R$. In this illustrative example, the experimental area ratio $$\left(\frac{A_b}{A_a} = \frac{C_{ped}}{C_{shrhd}}\right)$$

was 0.825 and the amplitude of the applied RF voltage $V_{RF}$ was 220 V. As can be seen, the model data fits with the experimental results. The model departs from linearly as the magnitude of the bleed current $i_R$ increases. The experimental electrode area ratio $$\frac{A_b}{A_a}$$

was 0.825 and the model-fit electrode area ratio $$\frac{A_b}{A_a}$$

was 0.899. The expected Bohm current $i_B$ was 90.70 mA and the model-fit Bohm current $i_B$ was 94.464 mA. These values for $i_B$ may divided by the electrode area $A_b$ (if known) to obtain the corresponding Bohm current density values $J_B$.

By fitting the model to the DC self-bias voltage $V_{DC\_bias}$ and bleed current $i_R$, the electrode area ratio $$\frac{A_b}{A_a},$$

total Bohm current $J_B$ received by powered electrode, and the RF voltage at the powered electrode $V_{RF}$ can be determined. The RF voltage at the powered electrode $V_{RF}$ can also be measured using an oscilloscope. If the RF voltage at the powered electrode $V_{RF}$ is measured, the model reduces to two unknowns.

The model does not require knowledge of plasma density or electron temperature. If the electron temperature $T_e$, the electrode area $A_b$ and the atomic mass of the ion species is known, a Bohm argument can be used to determine plasma density from the fitted Bohm current $i_B$. A differential bias resistance can also be derived by differentiating equation (11) with respect to bleed current $i_R$.

Figure 9:
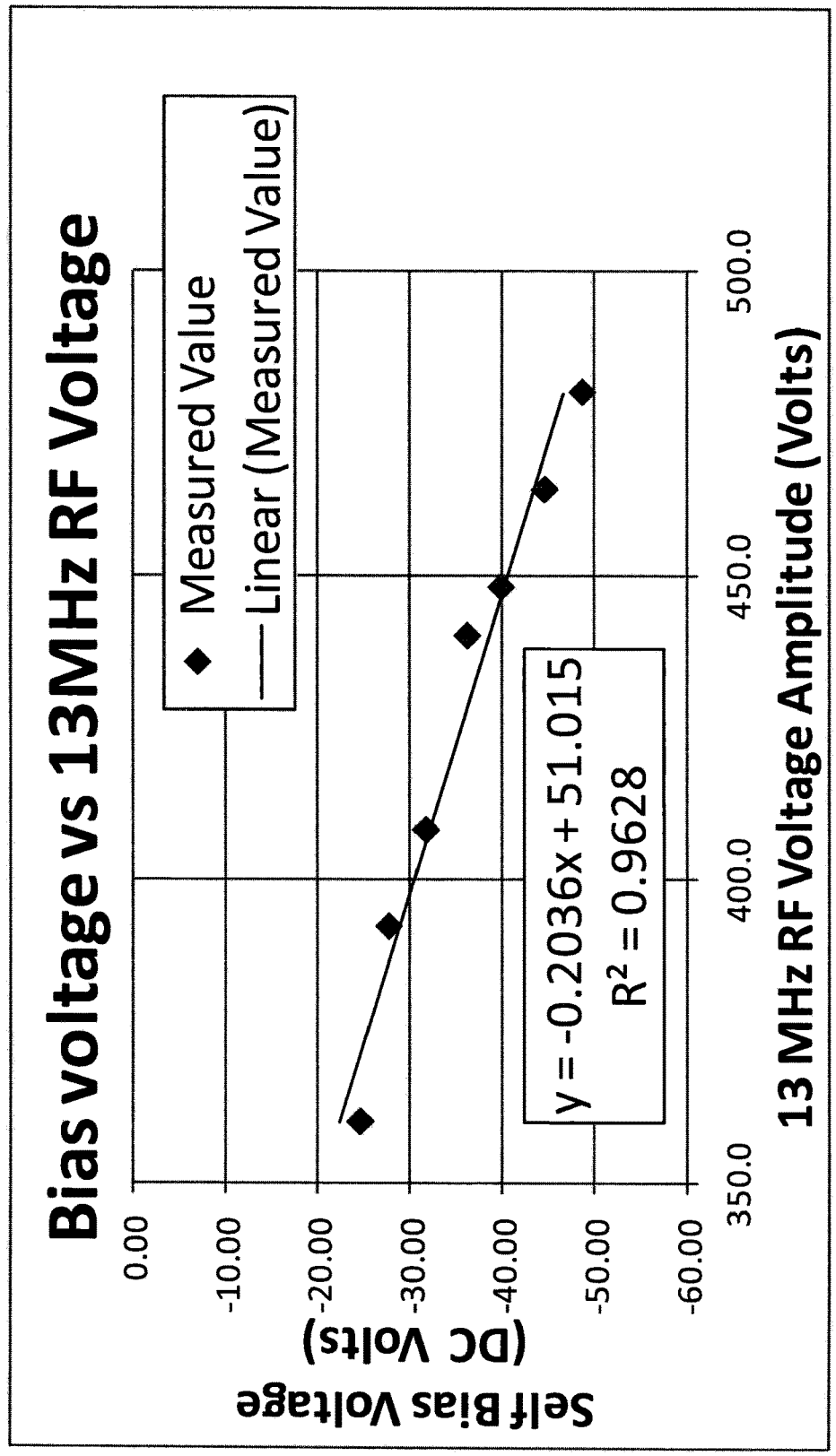
FIG. 9 illustrates DC self-bias voltage as a function of RF voltage.

Referring now to FIG. 9, the area ratio can alternatively be determined from Köhler, et. al., J. Appl. Phys. 57 (1), January 1985 using a voltage-centric model. Using a voltage-based approach, the RF and DC voltage conditions that must be satisfied over an RF cycle are determined and then an expression for DC self-bias voltage is derived.

$$V_{DC\_bias} = V_{RF}\left(\frac{C_{pwrd} - C_{grd}}{C_{pwrd} + C_{grd}}\right);$$

or $$\frac{C_{pwrd}}{C_{grd}} = \left(\frac{1 + \frac{V_{DC\_bias}}{V_{RF}}}{1 - \frac{V_{DC\_bias}}{V_{RF}}}\right)$$

The voltage-based approach also provides good results as well. The fitted slope was −0.204. The experimental area ratio $$\left(\frac{A_b}{A_a} = \frac{C_{ped}}{C_{shrhd}}\right)$$

was 0.815. The implied area ratio $$\left(\frac{A_b}{A_a} = \frac{C_{ped}}{C_{shrhd}}\right)$$

was 0.825. The model fit area ratio $$\left(\frac{A_b}{A_a} = \frac{C_{ped}}{C_{shrhd}}\right)$$

was 0.899.

With a few additional assumptions (electron temperature $T_e$, electrode area A and mass of the ion species ($M_i$)), the plasma density can also be estimated from the Bohm current using the relationship set forth below:

$$n = \frac{i_B}{A\sqrt{\frac{kT_e}{M_i}}}$$

where n is the plasma density, A is the electrode area, $M_i$ is the mass of the ion species in the plasma, k is Bolzman's constant and $T_e$ is the electron temperature (in units of eV). The plasma density can be used to vary an operating parameter of the substrate processing system.

Figure 10:
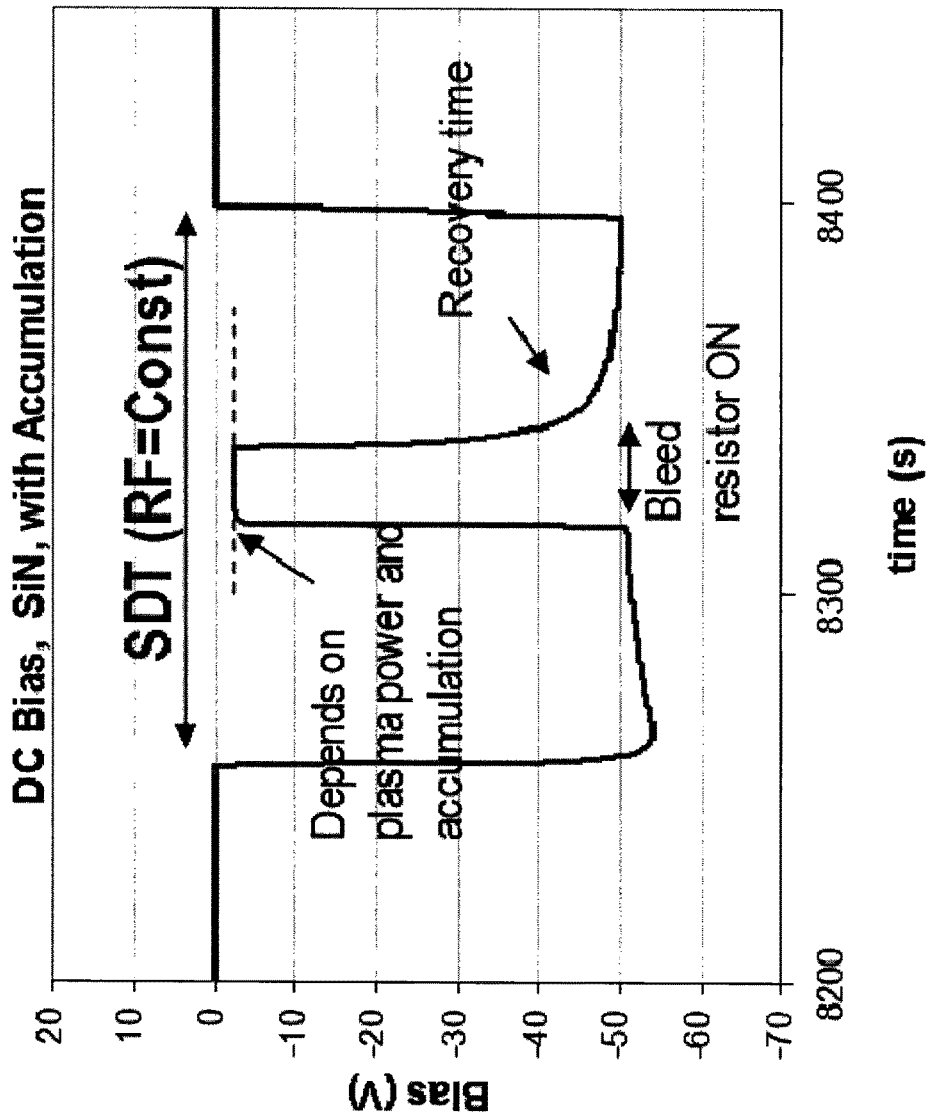
FIG. 10 illustrates DC self-bias voltage as a function of time.

In another example, the time dependent characteristics of the DC self-bias voltage are monitored as the variable resistor $R_V$ is switched into or out of the circuit or removed entirely from the circuit. For example only, a first value of $R_V$ is used to bleed current to ground. This will cause a shift in the DC self-bias voltage in accordance with the equations given above. Then, the resistor is removed from the circuit by opening the circuit. At this point, no bleed current is drawn and the DC self-bias voltage will transition over a brief period of time to a value corresponding to no bleed current as indicated in the equations given above. An example of this behavior is illustrated in FIG. 10.

Alternatively the variable resistor $R_V$ can switch from one resistance value to another resistance value and then the change in DC self-bias behavior can be monitored over time.

The behavior of the DC self-bias voltage during the recovery time shows a characteristic shape and recovery time similar to (but not the same as) that seen for an RC circuit. There will be a charging of the blocking capacitance but the charging current is mediated by the Bohm sheath mechanism. For example, an expression of the form below can be fit to the recovery of the DC bias voltage:

$$V_{DC\_bias}(t) = A + B \exp\left\{-\frac{(t-t_o)}{\tau}\right\}$$

where $\tau$ is a time constant and $t_0$ is the onset of the voltage change. Tracking of changes in $\tau$ provides a parameter by which changes in the system can be detected.

Figure 11:
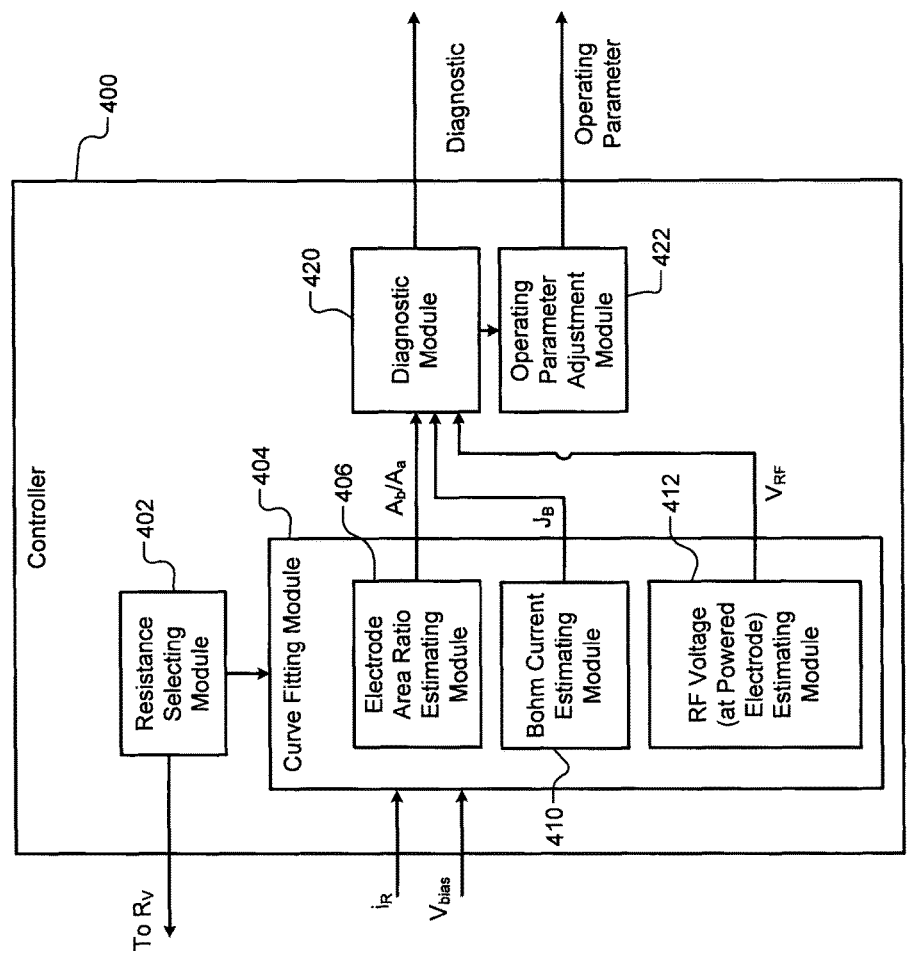
FIG. 11 is a functional block diagram of a controller that estimates electrode area ratio, Bohm current and RF voltage at the powered electrode based on the DC self-bias voltage and bleed current.

Referring now to FIG. 11, an example of a controller 400 is shown to include a resistance selecting module 402, a curve fitting module 404, a diagnostic module 420 and an operating parameter adjustment module 422. The curve fitting module 404 performs curve fitting based on the bleed current and DC self-bias voltage pairs for different values of the variable bleed resistor $R_V$. The curve fitting module 404 includes an electrode area ratio estimating module 406 to estimate the electrode area ratio, a Bohm current estimating module 410 to estimate the Bohm current and an RF voltage (at the powered electrode) estimating module 412 to estimate the RF voltage at the powered electrode.

Figure 12:
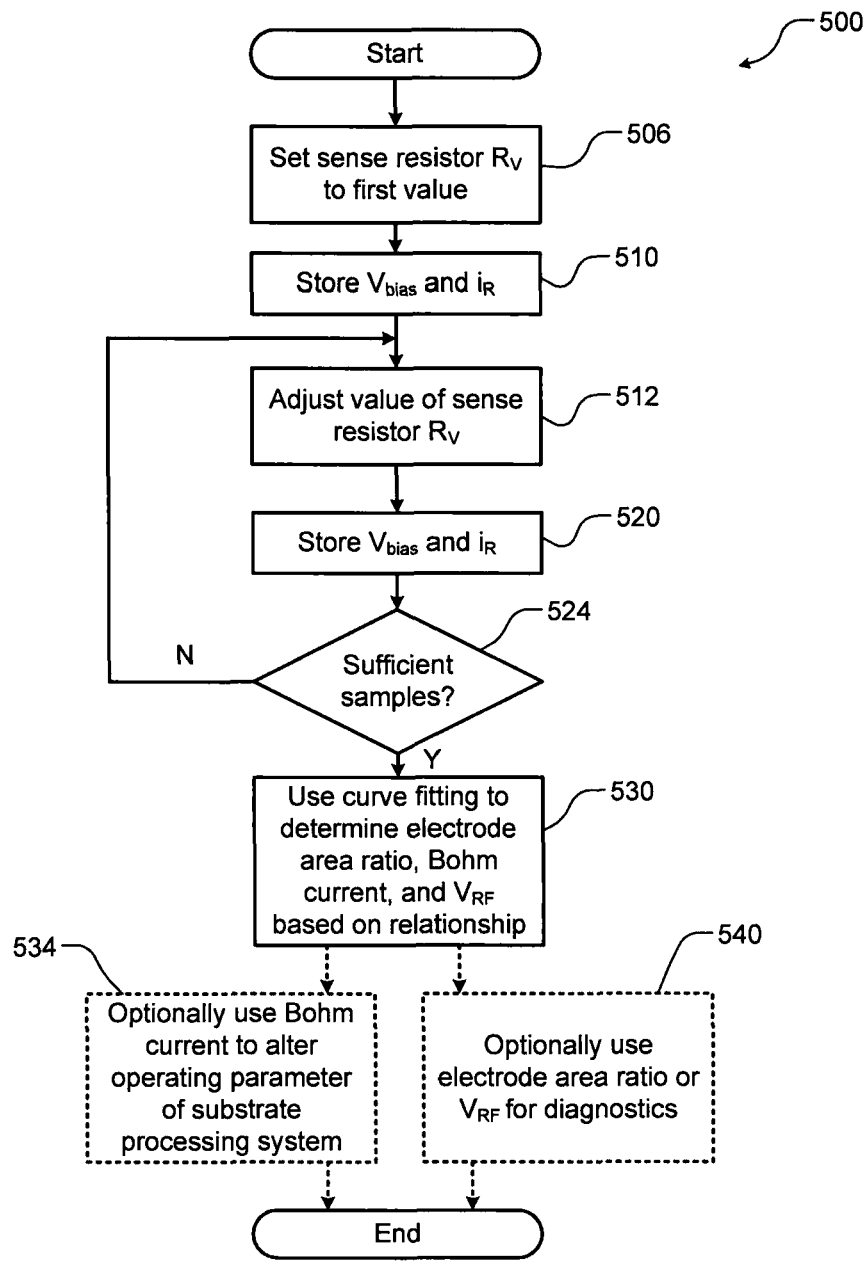
FIG. 12 is a flowchart illustrating an example of a method performed by the controller of FIG. 11.

Referring now to FIG. 12, an example of a method 500 for operating the controller is shown. The method includes setting a value of the variable bleed resistor $R_V$ to a first value at 506. At 510, the DC self-bias voltage and the bleed current $I_R$ are stored. At 512, a value of the variable bleed resistor $R_V$ is adjusted and the DC self-bias voltage and the bleed current $I_R$ are stored at 520. At 524, the controller determines whether there are sufficient samples. If false, control returns to 512. When 524 is true, the controller uses curve fitting to determine the electrode area ratio, the Bohm current and/or the RF voltage at the powered electrode based on the relationship set forth above at 530. At 534, control optionally uses the Bohm current to alter an operating parameter of the substrate processing system. At 540, control optionally uses the electrode area ratio or the RF voltage at the powered electrode for diagnosis purposes.

In this application, including the definitions below, the term controller or module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase of least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A substrate processing system, comprising:
a processing chamber including a showerhead, a plasma power source and a pedestal spaced from the showerhead to support a substrate,
wherein the plasma power source supplies first radio frequency (RF) power to create plasma between the showerhead and the substrate;
a probe arranged in the plasma;
a first capacitor;
an RF power source coupled by the first capacitor to the probe to supply second RF power; and
a controller configured to receive a measurement of a DC self-bias voltage across the first capacitor, receive a measurement of the second RF power supplied by the RF power source, and calculate a film thickness using the measurements of the second RF power and the DC self-bias voltage across the first capacitor.

2. The substrate processing system of claim 1, wherein the substrate processing system is configured to deposit film on the substrate and wherein the controller is configured to alter an operating parameter of the substrate processing system based on the film thickness.

3. The substrate processing system of claim 1, wherein the substrate processing system is configured to deposit film on the substrate, wherein the controller is configured to determine a rate of change in the film thickness, and wherein the controller is configured to alter an operating parameter of the substrate processing system based on the rate of change of the film thickness.

4. The substrate processing system of claim 1, wherein the substrate processing system generates the plasma using capacitive coupling.

5. The substrate processing system of claim 4, wherein the plasma power source is coupled to the showerhead and wherein the pedestal is connected to ground.

6. The substrate processing system of claim 1, wherein the second RF power is less than the first RF power.

7. The substrate processing system of claim 1, further comprising a voltage sensor circuit connected between the probe to measure the DC self-bias voltage.

* * * * *